United States Patent [19]

Evans

[11] 3,914,696

[45] Oct. 21, 1975

[54] CONTROLLABLE REFERENCE SUPPLY FOR TELEVISION TUNERS

[75] Inventor: Wayne Wheeler Evans, Carmel, Ind.

[73] Assignee: RCA Corporation, New York, N.Y.

[22] Filed: Jan. 18, 1974

[21] Appl. No.: 434,407

[52] U.S. Cl. ................ 325/422; 325/453; 325/465; 325/468; 331/36 R; 334/15; 334/16

[51] Int. Cl.[2] ........................ H03J 5/24; H04B 1/16

[58] Field of Search ....... 178/5.8 AF; 325/416, 418, 325/420, 422, 423, 346, 452, 453, 457, 464, 465, 468; 331/34, 36 R; 334/14–16

[56] References Cited

UNITED STATES PATENTS

| | | | |
|---|---|---|---|
| 3,233,179 | 2/1966 | Klettke | 325/469 |
| 3,440,544 | 4/1969 | Pampel | 325/422 |
| 3,693,094 | 9/1972 | Kanamaru et al. | 325/461 |
| 3,705,356 | 12/1972 | Russell | 325/465 |
| 3,750,028 | 7/1973 | Uchida | 325/418 |
| 3,828,257 | 8/1974 | Puskas | 325/418 |

*Primary Examiner*—Robert L. Griffin
*Assistant Examiner*—Marc E. Bookbinder
*Attorney, Agent, or Firm*—Eugene M. Whitacre; Stephan Siegel

[57] ABSTRACT

Voltage from a reference supply is subdivided to provide a plurality of channel representative tuning voltages for a voltage controlled television tuner. A portion of an automatic fine tuning voltage developed in the television receiver is coupled to the reference voltage supply for providing a feedback voltage to maintain the television receiver on the desired channel frequency. Addition of the portion of the automatic fine tuning voltage and the reference supply voltage is such that the portion of the automatic fine tuning voltage provided to the higher frequency channels is greater than the portion thereof supplied to the lower frequency channels.

12 Claims, 3 Drawing Figures

CONTROLLABLE REFERENCE SUPPLY FOR TELEVISION TUNERS

This invention relates to tuning systems for television receivers and more particularly to a controllable reference voltage supply for tuning a television receiver to a desired channel.

Television receivers of the type utilizing voltage controlled tuners require a particular level of tuning voltage to tune a desired television channel. In the operation of some television receivers, a fixed source of reference voltage is coupled to a resistor divider network. The resistor divider network subdivides the reference voltage into a plurality of lesser voltages corresponding to the voltages required to tune the voltage controlled tuner to desired television channels. A desired channel is tuned by coupling an appropriate one of the outputs of the resistor divider network to the voltage controlled tuner. Each of the voltages provided by this resistor divider network, however, may vary as the resistance elements of the voltage divider age. This change in resistance can, in turn, cause the voltages provided by the divider to change and thereby tune the television receiver to a frequency that is not appropriate to the desired television channel. Similarly, any changes in output voltage from the source of reference voltage provides the same undesired result of tuning the television receiver to an inappropriate frequency. To remedy this problem, automatic fine tuning voltage developed in the television receiver preferably is added to the tuning voltage so as to cause the tuner to tune to the desired channel frequency. One system utilized for adding an automatic fine tuning (AFT) voltage to the tuning voltages developed by a resistor voltage divider requires that the reference supply voltage of the divider be floating with respect to ground. If one terminal of the fixed reference supply is not direct current coupled to ground, the output voltages provided by the divider will be susceptible to noise pickup. It is therefore desirable to provide a reference voltage source having one of its output terminals direct current coupled to ground. It has also been found, where voltage controlled varactor tuners are used, that a greater amount of tuning voltage change is required to deviate the tuned frequency a given amount at the high end of the tuner frequency range than at the low end. Accordingly, it is desirable to form a controllable source of reference voltage by providing a means for adding the AFT voltage to the fixed reference source voltage such that the voltage provided for tuning to high frequency channels varies by a greater amount with changes of AFT voltage than the voltage provided for tuning to lower frequency channels.

In accordance with the present invention, a television receiver having a voltage controlled tuner is tuned by a tuning selector arrangement which includes a plurality of series connected resistor elements coupled to a reference voltage supply. A first output means is coupled to a first junction of the resistor elements of the above-mentioned series and provides a first controllable reference output voltage. A second output means is coupled to a second junction of resistor elements of the above-mentioned series and provides a second controllable reference output voltage different from said first output voltage. Means couple a source of automatic fine tuning voltage to the series coupled resistors for modifying the first and second output voltages with different portions of automatic fine tuning voltage.

A better understanding of the invention may be derived from the following description in connection with the accompanying drawings of which:

Figure 1:
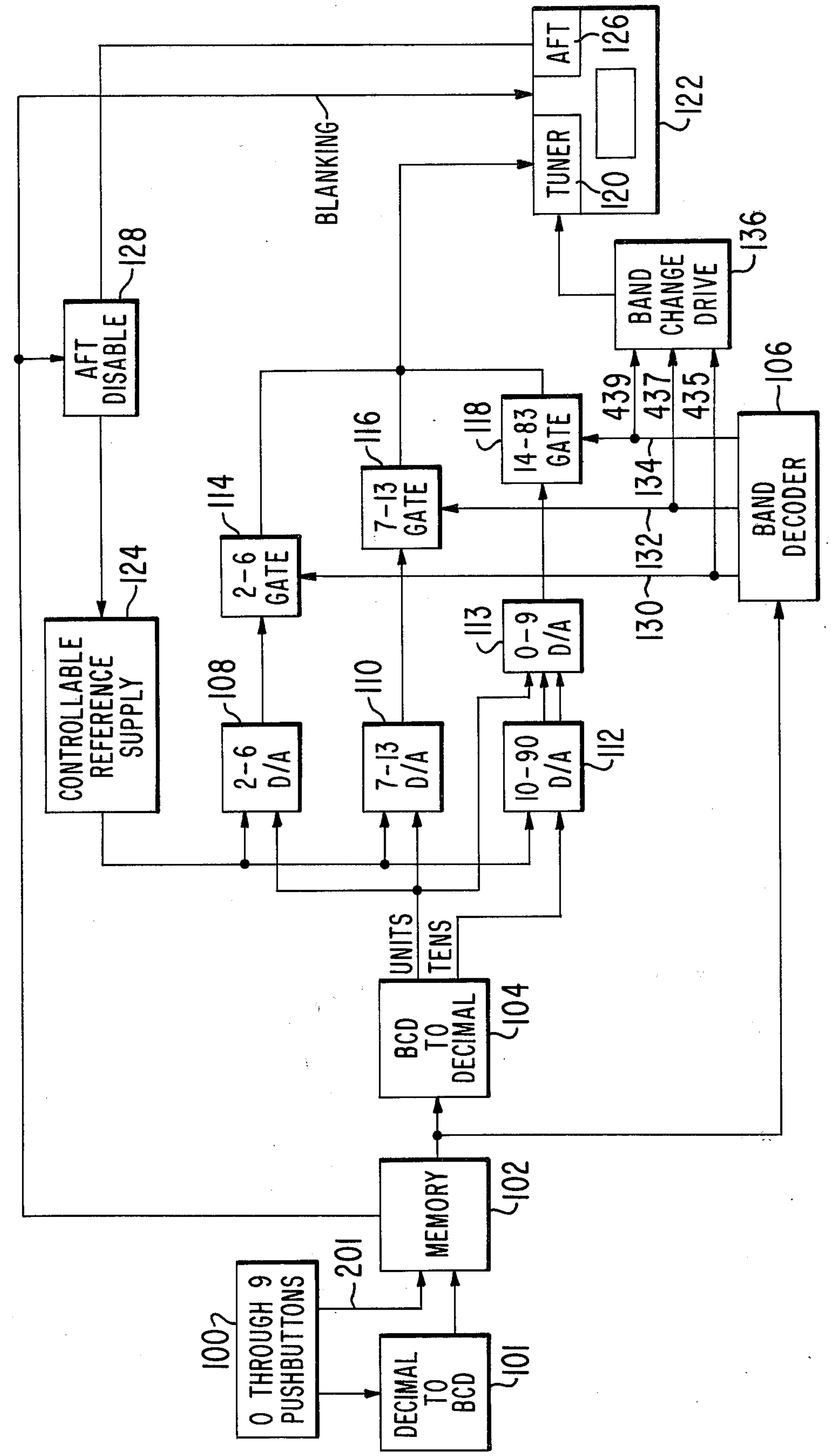
FIG. 1 is a block diagram of a channel selection system incorporating a controllable reference supply.

With reference to FIG. 1, an assembly including 10 touch or push button switches 100 (labelled 0 through 9) has buttons one through nine coupled to a decimal to binary-coded decimal (BCD) converter 101. The button assembly 100 may be of a type commonly employed in small electronic calculators. The output of converter 101 is coupled to a memory 102 wherein numerical representative electrical signals are stored. A separate line 201 from assembly 100 couples a zero digit output directly to memory 102.

Memory 102 is coupled to a BCD to decimal decoder 104 and also to a band decoder 106. A numerical display (not shown) may also be coupled to memory 102 or decoder 104 for providing a display of the selected television channel number. Three digital to analog (D/A) converters 108, 110 and 113 are coupled to a units output of decoder 104. A fourth D/A converter 112 is coupled to a tens output of decoder 104. Transfer gates 114, 116 and 118 are coupled to the respective outputs of digital to analog converters 108, 110 and 113. The output terminals of transfer gates 114, 116 and 118 are coupled in common to a voltage controlled tuner 120 associated with a television receiver 122. Tuner 120 may include separate UHF and VHF tuner portions such as the RCA model KRK 194 UHF tuner and the RCA KRK 155 VHF tuner which are shown in RCA Television Service Data, File 1973, No. C-10, published by RCA Corporation, Indianapolis, Ind. Each of the above-named tuners utilizes varactor tuning elements to control tuner frequency but it should be recognized that other types of voltage controlled tuners may be used as well.

Band decoder 106 has three output lines 130, 132 and 134 respectively coupled to control terminals of transfer gates 114, 116 and 118 and to input terminals on band change drive circuit 136. Drive circuit 136 is coupled to tuner 120 and provides voltage levels to switch frequency bands in tuner 120 as is set forth in the above-referenced Service Data.

A controllable source of reference voltage 124 is coupled to D/A converters 108, 110 and 112 and provides a voltage level from which analog tuning signals are derived. An automatic fine tuning (AFT) circuit 126, for example, of the type shown in the above-referenced Service Data, is located within television receiver 122 and is coupled to the controllable reference source 124 through an AFT disable circuit 128. AFT circuit 126 provides a variable correction voltage for modifying the output voltage supplied by the source of reference voltage 124.

A blanking output from memory 102 is coupled to receiver 122 and to AFT disable circuit 128 for inhibiting operation of such circuits as AFT, sound and video, whenever the channel changing or selection process is in progress.

In the operation of the system shown in FIG. 1, one of the buttons of assembly 100, representative of the tens digit of the desired television channel, is depressed by the viewer. Although assembly 100 is referred to as having push button switches, other type devices which provide contact closure or electrical circuit closure may be used. If the desired channel is any one of channels 2 through 9, the zero (0) button is depressed first. If the desired channel is any one of those in the range of channels 10 through 83, a corresponding tens digit of one through eight (1–8) is depressed. Depression of one of the buttons of assembly 100 produces a signal either on one of nine lines (shown diagrammatically as a single line) at the output of assembly 100, which signal is coupled to decimal to BCD converter 101, or, if the digit is zero, on the tenth line 201 which is coupled directly to memory 102. Converter 101 converts the signal derived from button assembly 100 into a binary coded decimal (BCD) number and transfers it via four lines (shown as a single line) to a tens register in memory 102. Upon entry of a first digit of the two digit channel command into memory 102, a blanking signal is supplied from memory 102. This blanking signal operates to blank the displayed image, mute the sound of television receiver 122 and disable the output of AFT signals from AFT circuit 126. AFT signals are disabled during channel change to allow channel change without any effect by the AFT signals.

To complete the channel selection command; a units digit 0 through 9 is selected. The selected button of assembly 100 is depressed, providing a signal on the appropriate one of the 10 associated output lines. As before, if the number is any of the numbers one through nine, converter 101 converts the signal from button assembly 100 into a BCD number and memory 102 stores this number in an associated units register. A zero is coupled directly to memory 102. Upon receiving this second (units) digit command, memory 102 ceases providing the blanking signal to television receiver 122, restoring sound and video and inactivating AFT disabling circuitry 128.

Eight output lines (shown as a single line) representing the tens and units digits of the channel information stored in binary coded decimal form in memory 102 are coupled to BCD to decimal decoder 104 and to band decoder 106. Bank decoder 106 decodes the BCD numbers supplied from memory 102 and provides output signals on one of three output lines to indicate in which of three bands the selected channel lies. For example, channels 2 through 6 are considered to be in band 1, channels 7 through 13 are in band 2 and channels 14 through 83 are in band 3. Additional output lines and decoding circuitry may be added to decoder 106 for providing output signals corresponding to other bands, for example, channels 84 through 89 and 90 through 99, which may then correspond to channels used for other functions such as cable television. Output lines 130, 132, and 134 from band decoder 106 are respectively coupled to the control terminals of transfer gates 114, 116 and 118 and provide signals to selectively operate one of these gates in response to a channel command. Gates 114, 116 and 118 operate to pass a selected one of the simultaneously derived analog tuning voltages developed respectively by D/A converters 108, 110 and 113 to tuner 120.

BCD to decimal decoder 104 decodes the information supplied on eight BCD lines provided by memory 102 into information supplied on 20 lines (shown diagrammatically as two lines labelled "units" and "tens"), the first 10 of which correspond to a tens digit and the second 10 of which correspond to a units digit. The unit lines of decoder 104 are coupled to D/A converters 108, 110 and 113 and provide a numerical representative signal which is to be converted into an analog voltage. Similarly, the tens lines from decoder 104 are coupled to D/A converter 112, providing the tens digit signal to be converted into an appropriate analog voltage. It is not necessary to provide a tens line to converter 110 since the seven channel numbers in the range of 7 to 13 can be uniquely selected with an appropriate units digit (e.g., eight equals channel eight, two equals channel 12) and the necessary band selection signal. A detailed explanation of the operation of the associated D/A converters is given below with reference to FIG. 2.

Analog voltages derived from D/A converters 108 and 110 correspond, respectively, to the tuning voltage ranges required to tune tuner 120 to channels 2 through 6 and 7 through 13. In tuning tuner 120 to channels 14 through 83, however, two D/A converters are utilized in order to derive the requisite tuning voltages. D/A converter 112 is responsive to the tens digit portion of the channel command and provides, for each tens digit command, two voltage outputs which correspond to the end channels of a tuning range of eleven channels, i.e., 10–20, 20–30, etc. The voltage range provided by converter 112 is further subdivided by converter 113 into voltages corresponding to individual ones of the channels within the selected 11 channel tuning range. That is, converter 113 is responsive to the units digit portion of the channel command and provides a single tuning voltage at its output corresponding to the selected channel in the particular tuning range (e.g., 14 through 83).

In order to provide the requisite analog tuning voltages, D/A converters 108, 110 and 112 receive a reference voltage from reference source 124. Reference source 124 contains a relatively constant voltage supply. In addition, reference source 124 is arranged such that its output voltage is modulated by the automatic fine tuning (AFT) voltage developed in television receiver 122. AFT voltage developed in television receiver 122 is responsive to the deviation in frequency between the received television signal picture carrier wave and the frequency of the carrier wave to which the television receiver is tuned. Typically, this frequency deviation is sensed in terms of a difference between the frequency of the converted intermediate frequency picture carrier and a fixed tuned circuit. The resulting AFT correction voltage is coupled to and operates to change the voltage coupled from reference supply 124 to the D/A converters 108, 110 and 112. The voltage provided by reference supply 124 varies in response to the AFT voltage to change the tuning voltage supplied to tuner 120 and thereby minimize the frequency error between the desired received signal and the operating condition of the tuner. A detailed explanation of a controllable reference source is given below (following the description of FIG. 2) with reference to FIG. 3.

Figure 2:
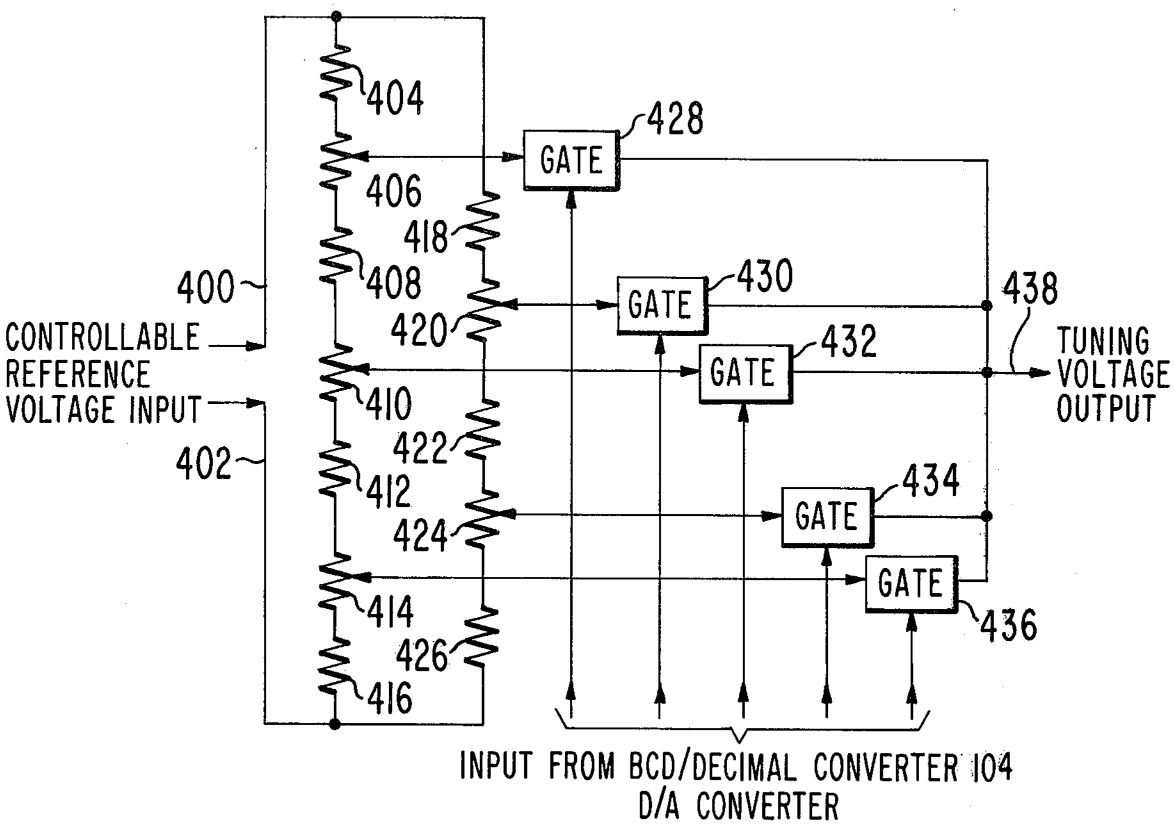
FIG. 2 is a partial block and schematic drawing of a digital to analog converter as illustrated in FIG. 1.

FIG. 2 illustrates a detailed representation of a D/A converter such as 2–6 D/A converter 108. Input terminals 400 and 402 are respectively coupled to the output terminals of buffer amplifiers 310 and 312 of the controllable reference supply (see FIG. 3). An alternating series of resistors and potentiometers 404, 406, 408, 410, 412, 414 and 416 is coupled across input terminals 400 and 402. A second alternating series of resistors and potentiometers 418, 420, 422, 424 and 426 is similarly coupled across input terminals 400 and 402. Gates 428, 430, 432, 434 and 436 are respectively coupled to the arms of potentiometers 406, 420, 410, 424, and 414. Output signals from each of the gates are coupled in common to an output terminal 438. Control signals to operate each of the five respective gates are provided by signals coupled from five of the 10 units lines (shown in FIG. 1 as a single line) of BCD to decimal converter 104.

In the operation of the above-described circuit, a reference voltage (as derived, for example, from the apparatus of FIG. 3) is coupled across inputs 400 and 402. This reference voltage supplies a current to the alternating series of resistors and potentiometers 404, 406, 408, 410, 412, 414 and 416 and also to the alternating series of resistors and potentiometers 418, 420, 422, 424 and 426. Voltages produced with respect to ground at the arms of potentiometers 406, 410, 414, 420 and 424 are adjusted such that the voltage provided to gate 428 from potentiometer 406 corresponds, in the given band, to tuning of the receiver to a particular channel of a relatively higher frequency, for example, channel 6, while that provided to gate 430 from potentiometer 420 is a lesser voltage and may correspond to tuning of the receiver to a lower frequency channel, for example, channel 5. Similarly, the voltages provided to gates 432, 434 and 436 by respective potentiometers 410, 424 and 414 are decreasing in value and correspond to lower frequency channels, for example, channels 4, 3 and 2 respectively. An input signal provided from converter 104 activates a particular input line corresponding to one of the gates, thereby allowing the selected gate to close and pass the voltage at its particular input to the tuning voltage output terminal 438. The above-described D/A converter has been illustrated with potentiometers for adjusting individual output voltages to correspond to particular television channels and to allow for variation in tuning voltage requirements of different tuners. Since the channel to which the television receiver is tuned is determined by the voltage applied to its tuner, it may be expected that component variation or aging effects will cause the tuning to change over a period of time. By adding the AFT voltage to the controllable reference source in the manner described, these undesirable effects may be avoided. Proper-tuning of the television receiver is thereby achieved with little regard for component aging effects.

D/A converters 110, 112 and 113 operate in a similar manner to the converter illustrated in FIG. 2. In the operation of converter 112, however, the output voltages provided thereby correspond to channels spaced a decade apart rather than individual channel numbers, i.e., channels 10, 20, 30, etc. Note, channel 10 and similarly channel 90 do not correspond to channels that can be tuned by the UHF portion of tuner 120. Consequently, the output voltages from converter 112 corresponding to channels 10 and 90, are voltage levels determined by approximately linear extrapolation of the voltage verses frequency curve of the associated UHF tuner. By appropriately gating converter 112 so as to select and couple two adjacent decade output lines, for example, channels 20 and 30 of converter 112 to the input terminals of D/A converter 113, the voltages provided thereby may be further subdivided into voltages corresponding to 10 individual channels. A more detailed description of a suitable combination of series coupled D/A converters may be found in my copending U.S. application entitled, ANALOG VOLTAGE GENERATORS FOR TELEVISION TUNERS, Ser. No. 434,402, assigned to RCA Corporation now U.S. Pat. No. 3,882,481.

Figure 3:
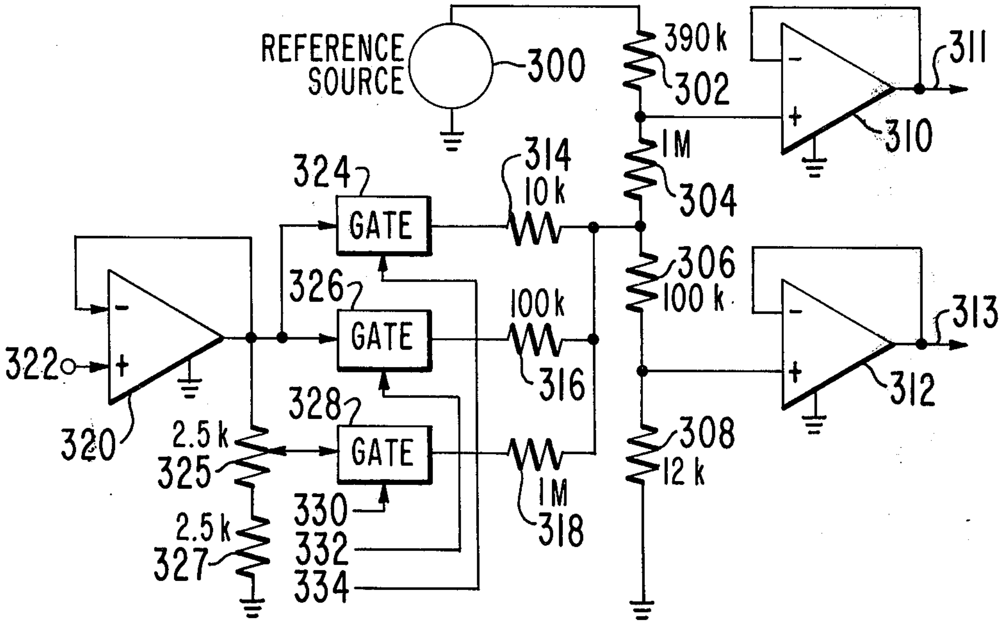
FIG. 3 is a partial block and schematic drawing of a controllable reference supply incorporating the invention.

FIG. 3 illustrates a controllable reference supply suitable for use in the system of FIGS. 1 and 2. A source of reference voltage 300 is coupled to a seriesconnected array of resistance elements 302, 304, 306 and 308. A first output amplifier 310 has a non-inverting input coupled to the junction of resistors 302 and 304. A second output amplifier 312 has a non-inverting input coupled to the junction of resistors 306 and 308. A third amplifier 320 has a non-inverting input terminal 322 for receiving AFT voltage signals. Amplifers 310, 312 and 320 are operational amplifiers such as the model ULN 2158M manufactured by Sprague Electric Company, North Adams, Mass. An output terminal from amplifier 320 is returned to its own inverting input terminal, to input terminals on gates 324 and 326 and to a series combination of potentiometer 325 and resistor 327. A third gate 328 has an input coupled to an arm of potentiometer 325. Output terminals from gates 324, 326 and 328 are respectively coupled to resistors 314, 316 and 318. Resistors 314, 316 and 318 are coupled in common to the junction of resistor elements 304 and 306. Control lines 330, 332 and 334 are respectively coupled to control input terminals on gates 324, 326 and 328 and also to respective output lines 130, 132 and 134 of band decoder 106 in FIG. 1.

In the operation of the above-described circuit, a substantially fixed voltage from reference source 300 provides a current to resistors 302—308. Reference source 300 may be any of the well-known arrangements for providing a relatively constant voltage with respect to a reference level (e.g., ground). A suitable reference source can be constructed by coupling a zener reference diode to the input of a voltage regulator integrated circuit such as a type CA3085 manufactured by RCA Corporation, Somerville, N.J. The voltage across resistor 308 as a result of the current provided by reference source 300 is coupled to amplifier 312. Amplifier 312 provides substantially unity gain and impedance translation form a relatively high impedance level at its input terminal to a relatively low impedance level at its output terminal. Similarly, current produced by reference source 300 provides a voltage at the junction of resistors 302 and 304 to an input terminal of amplifier 310. The voltage supplied to the input of amplifier 310 is of a greater magnitude than that supplied to the input of amplifier 312 and is also reproduced with substantially unity gain. Amplifier 310 also has a relatively high input impedance and a relatively low output impedance. Automatic fine tuning voltage provided by AFT circuitry 126 in television receiver 122 is coupled to terminal 322 of amplifier 320. Amplifier 320 also provides unity gain to AFT signals with relatively high input and relatively low output impedance. Band decoder 106 determines in which of the three frequency bands, low VHF (channels 2–6), high VHF (channels 7–13) or UHF (channels 14–83), the selected television channel is located and supplies a signal to a respective line 330, 332 or 334. The signal supplied thereby causes a selected gate 324, 326 or 328 to close and pass AFT voltage signals through one of the series resistors 314, 316 or 318 to the junction of resistors 304 and 306. For example, when a channel in the UHF band is selected, gate 328 is caused to close. AFT signals provided by amplifier 320 are then coupled to gate 328 through a voltage divider comprised of potentiometer 325 and resistor 327. Potentiometer 325 provides a precise adjustment of the amount of AFT voltage necessary for proper operation of an associated tuner.

Resistors 314, 316 and 318 are of different values in accordance with the amount of AFT voltage desired for each of the different bands. A different amount of AFT voltage is provided for each of the different tuner bands in order to maintain the AFT loop gain in the television receiver relatively constant. Typically, the tuning response in each of the different bands provides a different amount of frequency deviation for a given amount of control voltage. Therefore, the AFT voltage applied to the tuner should be appropriately adjusted to maintain a relatively constant loop gain. Similarly, in each of the three bands, the tuner response varies in accordance with the frequency to which it is tuned. At the low frequency end of each band, less change in tuning voltage is required for a given amount of frequency deviation than at the high frequency end of a respective band. The tuning response of a typical varactor tuner is such that for a given frequency deviation, about three times the amount of tuning voltage change is required at the high frequency end than at the low frequency end of a band. Accordingly, in each of the tuner bands, it is desirable to provide an increase in AFT correction voltage for higher tuned frequencies as compared to lower tuned frequencies. By selecting the ratio of resistors 302 to 304, 304 to 306 and 306 to 308, the AFT voltage may be caused to provide different changes in voltage at the inputs to amplifiers 310 and 312 (e.g., a ratio of 3 to 1). Thus, for example, for a one unit change in AFT voltage supplied to amplifier 312, the voltage change at the input of amplifier 310 may be arranged to be three times greater than the voltage change at the input of amplifier 312. This ratio of voltage change (3 to 1) provides the desired output response of causing the tuning voltage provided by amplifier 310, utilized to tune higher frequency channels, to vary over a wider range with applied AFT correction than the output voltage provided by amplifier 312 which is utilized to tune the lower frequency channels.

Thus, by applying AFT correction voltage to the network of resistors 302, 304, 306 and 308 through either resistors 314, 316 or 318, reference output voltages can be provided having desired proportions and amplitudes of AFT correction voltage. Furthermore, by virtue of the described arrangement, it is possible that the source of fixed reference voltage 300 can be referenced with respect to ground. By maintaining a ground reference on the reference voltage source 300, stability and regulation of the reference voltage is facilitated.

What is claimed is:

1. In a television receiver having a voltage controlled tuner, a tuning voltage supply arrangement comprising:

a reference voltage supply;

a plurality of series connected resistor elements coupled to said reference voltage supply;

a first output means coupled to a first junction of said series connected resistor elements for providing a first controllable reference output voltage;

a second output means coupled to a second junction of said series connected resistor elements for providing a second controllable reference output voltage different from said first output voltage;

a source of automatic fine tuning correction voltage; and means coupling said source of automatic fine tuning voltage to a third junction of said series-connected resistor elements for modifying said first and second output voltages with different voltage contributions from said automatic fine tuning voltage such that said first output means receives a greater automatic fine tuning voltage than said second output means.

2. The apparatus of claim 1 wherein:

said automatic fine tuning voltage is coupled to said series connected resistor elements intermediate said first and second output means.

3. The apparatus of claim 3 wherein:

said first junction is intermediate two of said resistor elements and said second junction is intermediate two others of said resistor elements.

4. The apparatus of claim 1 wherein:

said reference supply has a terminal coupled to ground and provides a reference voltage with respect to ground.

5. The apparatus of claim 4 wherein:

said first output means comprises an amplifier having a relatively high impedance input terminal coupled to said plurality of resistor elements and an output terminal for providing signals at a relatively low impedance.

6. The apparatus of claim 5 wherein:

said second output means comprises an amplifier having a relatively high impedance input terminal coupled to said plurality of resistor elements and an output terminal for providing signals at a relatively low impedance.

7. The apparatus of claim 6 wherein said coupling means comprises:

an amplifier having an input terminal for receiving automatic fine tuning voltage and an output terminal for providing said tuning voltage at a relatively low impedance; and at least one resistance element coupled between said last-named output terminal and said their junction of said plurality of resistor elements for coupling said automatic fine tuning voltage to said first and second output means.

8. The apparatus of claim 6 wherein said coupling means comprises:

an amplifier having an input terminal for receiving automatic fine tuning voltage and an output terminal for providing said tuning voltage at a relatively low impedance;

first and second resistance elements coupled in commmon with said third junction of said plurality of resistor elements;

first and second gates each having input terminals for receiving automatic fine tuning voltage from said amplifier, output terminals respectively coupled to said first and second resistance elements and control terminals for receiving signals to control said gates; and means for providing control signals to one of said control terminals in response to a selection of a particular tuning voltage.

9. The apparatus of claim 7 wherein said plurality of resistor elements are proportioned such that automatic fine tuning voltage provided to said first output means is substantially three times greater than the automatic fine tuning voltage provided to said second output means.

10. In a television receiver having a voltage controlled tuner, a tuning voltage supply arrangement comprises:

a reference voltage supply;

first, second, third and fourth resistance elements coupled in series across said reference voltage supply;

first output amplifier having an input coupled between said first and second resistance elements and an output terminal for providing a first output voltage;

a second output amplifier having an input coupled between said third and fourth resistance elements and an output terminal for providing a second output voltage different than said first output voltage;

fifth and sixth resistance elements coupled in common to the junction of said second and third resistance elements;

a source of automatic fine tuning voltage;

an amplifier having an input for receiving said automatic fine tuning voltage and an output for providing said voltage at a relatively low impedence;

first and second gates each having input terminals coupled to said last-named amplifier, output terminals respectively coupled to said fifth and sixth resistance elements and control terminals for receiving signals to control said gates; and means for selectively closing a particular one of said gates to couple automatic fine tuning voltage to said first and second output amplifiers through either said fifth or sixth resistance element.

11. The apparatus of claim 10 wherein:

said reference supply has a terminal coupled to ground and provides a reference voltage with respect to ground.

12. The apparatus of claim 11 wherein:

the values of said first, second, third and fourth resistance elements are proportioned such that automatic fine tuning voltage provided at the junction of said second and third resistance elements appear at the junction of said first and second resistance elements at a magnitude of substantially three times greater than the magnitude of fine tuning voltage at the junction of said third and fourth resistance elements.

* * * * *

UNITED STATES PATENT OFFICE
CERTIFICATE OF CORRECTION

PATENT NO. : 3,914,696

DATED : October 21, 1975

INVENTOR(S) : Wayne Wheeler Evans

It is certified that error appears in the above-identified patent and that said Letters Patent are hereby corrected as shown below:

Column 3, Line 46, that portion reading "Bank" should read --Band--. Column 6, Line 49, that portion reading "form" should read --from--. Column 8, Line 22, that portion reading "3" should read --2--. Column 8, Line 49, that portion reading "their" should read --third--. Column 8, Line 60, that portion reading "commmon" should read --common--.

Signed and Sealed this

*sixth* Day of *April 1976*

[SEAL]

*Attest:*

RUTH C. MASON
*Attesting Officer*

C. MARSHALL DANN
*Commissioner of Patents and Trademarks*